(12) United States Patent  
Nguyen et al.

(10) Patent No.: US 12,209,923 B1  
(45) Date of Patent: Jan. 28, 2025

(54) PLATFORM WITH TRENCH FOR OPTICAL FIBER WITH SENSORS

(71) Applicant: iSenseCloud, Inc., San Jose, CA (US)

(72) Inventors: Huy D. Nguyen, San Jose, CA (US); An-Dien Nguyen, Fremont, CA (US); Sepand Momeni, San Carlos, CA (US)

(73) Assignee: iSenseCloud, Inc., San Jose, CA (US)

( * ) Notice: Subject to any disclaimer, the term of this patent is extended or adjusted under 35 U.S.C. 154(b) by 565 days.

(21) Appl. No.: 17/493,047

(22) Filed: Oct. 4, 2021

Related U.S. Application Data

(60) Provisional application No. 63/090,159, filed on Oct. 9, 2020.

(51) Int. Cl.
- *G01L 1/24* (2006.01)
- *G01K 11/3206* (2021.01)
- *H01L 21/66* (2006.01)

(52) U.S. Cl.
CPC .......... *G01L 1/246* (2013.01); *G01K 11/3206* (2013.01); *H01L 22/12* (2013.01)

(58) Field of Classification Search
CPC ...... G01K 11/3206; G01K 1/14; G01N 29/14; G01N 29/2418; G01N 29/2462; G02B 6/02076; G02B 6/0208; G02B 6/32; G02B 6/4204; H01J 2237/24585; H01J 37/32917; H01L 21/67109; H01L 21/6831; H01L 21/6833; H01L 21/68742; H01S 5/0617; H01S 5/06804; H01S 5/06808; H01S 5/4087
USPC .......................................................... 356/237
See application file for complete search history.

(56) References Cited

U.S. PATENT DOCUMENTS

| | | | |
|---|---|---|---|
| 2013/0139606 A1* | 6/2013 | Swinehart | G01L 1/246 73/800 |
| 2018/0041743 A1* | 2/2018 | Ellwood, Jr. | H04N 3/14 |
| 2019/0006157 A1* | 1/2019 | O'Banion | H01L 21/67109 |

* cited by examiner

*Primary Examiner* — Sunghee Y Gray  
(74) *Attorney, Agent, or Firm* — W. Eric Webostad

(57) ABSTRACT

Apparatuses and methods therefor generally relate to sensing. In one example of such an apparatus, there is a platform. An optical fiber with Fiber Bragg Grating sensors is located in a trench formed in the platform. The trench has curved sections. The Fiber Bragg Grating sensors are respectively in the curved sections of the trench.

17 Claims, 8 Drawing Sheets

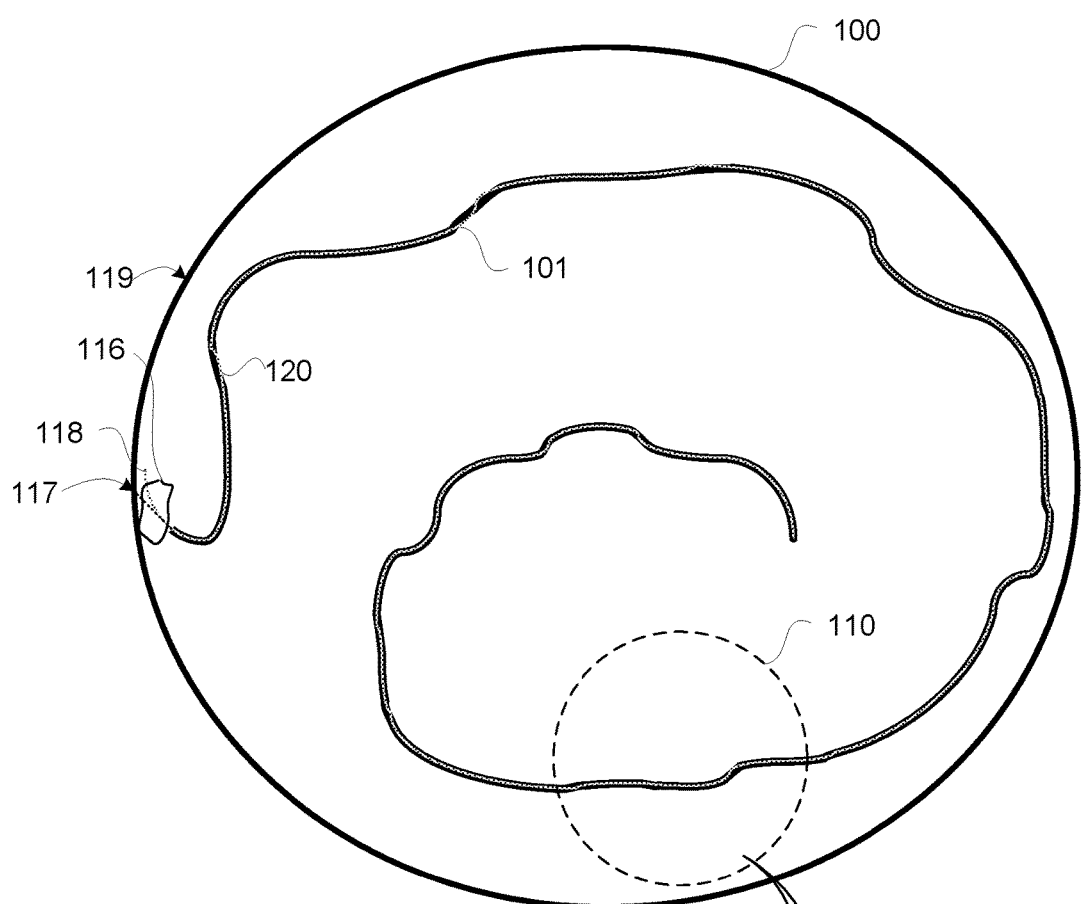
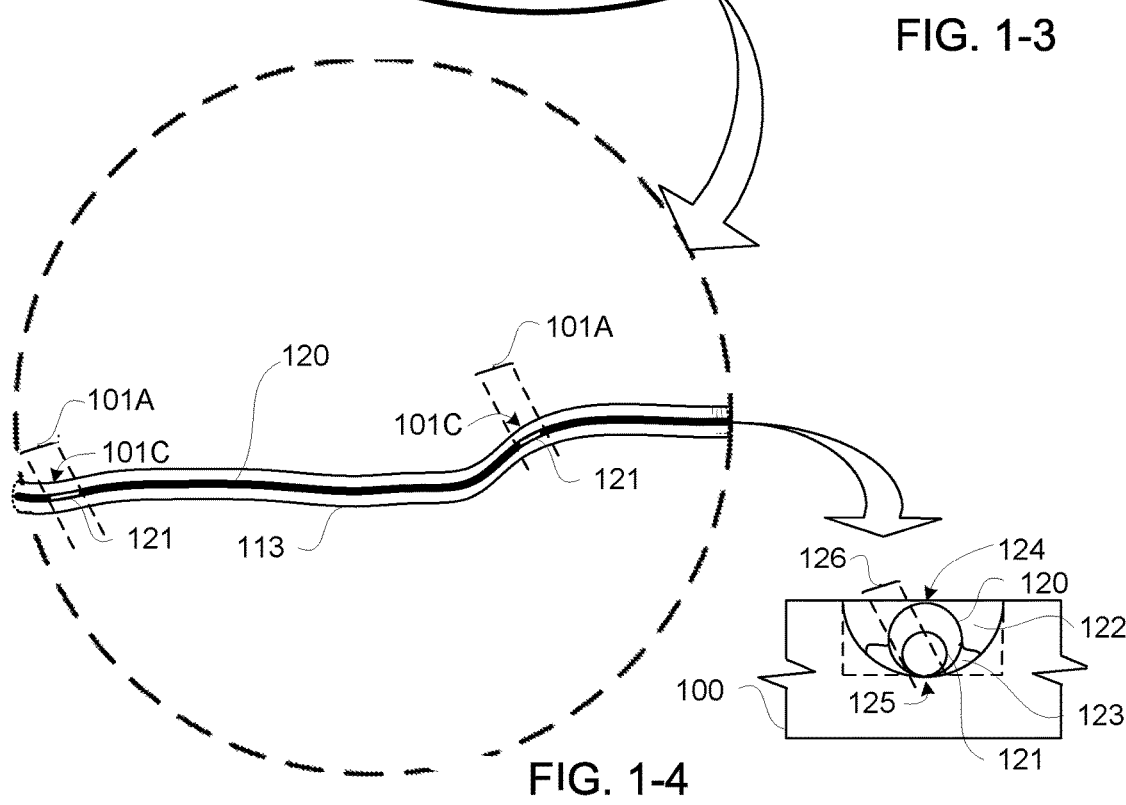
FIG. 1-3
FIG. 1-4

PLATFORM WITH TRENCH FOR OPTICAL FIBER WITH SENSORS

CROSS-REFERENCE TO RELATED APPLICATIONS

This application claims benefit of priority to U.S. Provisional Application No. 63/090,159, filed Oct. 9, 2020, and the entirety of the aforementioned provisional application is hereby incorporated by reference herein for all purposes consistent herewith.

FIELD

The following description relates generally to sensing. More particularly, the following description relates to a platform with a trench for sensing with an optical fiber having sensors.

INTRODUCTION

For monitoring, an optical fiber with sensors may be used. Along those lines, Fiber Bragg Gratings ("FBGs") may be formed from such optical fiber so as to be integral therewith to provide sensors. Such sensors may be spaced apart from one another, and at least one end of such optical fiber may be connected to a sensing system.

BRIEF SUMMARY

An apparatus generally relates to sensing. In such an apparatus, there is a platform. An optical fiber with Fiber Bragg Grating sensors is located in a trench formed in the platform. The trench has curved sections. The Fiber Bragg Grating sensors are respectively in the curved sections of the trench.

A method generally relates to sensing. In such a method, a platform is obtained. An optical fiber with Fiber Bragg Grating sensors is placed in a trench formed in the platform, wherein the trench has curved sections. The Fiber Bragg Grating sensors are positioned respectively in the curved sections of the trench for line contacts along portions of the curved sections of the trench along a sidewall surface thereof. The optical fiber is coupled to the platform for maintaining the line contacts.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 1-2 is a planar diagram of a top-down view depicting an example of an enlarged portion of the example test wafer of FIG. 1-1 with enlarged cross-sectional views of a portion of thereof for different types of trench profiles.

FIG. 1-3 is a planar diagram of a top-down inclined view depicting an example of another test wafer.

FIG. 1-4 is a planar diagram of a top-down view depicting an example of an enlarged portion of the test wafer of FIG. 1-3 with an enlarged cross-sectional view of a portion thereof.

FIGS. 2-1 through 2-6 are planar diagrams of respective cross-sectional views depicting examples of trenches of corresponding portions of test wafers.

FIGS. 3-1 and 3-2 are respective planar diagrams of cross-sectional views depicting examples of surface mounting of optical fiber to corresponding portions of test wafers.

FIGS. 4-1 through 4-3 are block diagrams of respective side views depicting examples of optical fiber normal force attachment.

FIG. 5-1 is a perspective diagram of a cross-sectional cutaway view depicting an example of a portion of a test wafer having a sensor positioned in a curved section of a trench.

FIG. 5-2 is a perspective diagram of a cross-sectional view depicting an example of a portion of a test wafer having an optical fiber positioned in a section of a trench.

FIG. 6-1 is a planar diagram of a top-down view depicting an example of a flexible strip having a trench.

FIG. 6-2 is a planar diagram of a top-down view depicting another example of a flexible strip having a trench.

FIG. 8-1 is a perspective diagram of a cross-sectional view depicting an example of a portion of a test wafer having an optical fiber positioned in a section of a trench with a cover layer.

FIG. 8-2 is a perspective diagram of a cross-sectional view depicting an example of a portion of a test wafer having an optical fiber positioned in a section of a trench with a deposited cover layer.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items, however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Fiber Bragg Gratings ("FBGs") may be used in a sensing system. A Fiber Bragg Grating ("FBG") sensor array may be interrogated by a broadband light source-based sensing system for temperature and strain sensing and/or a laser-based detection system for acoustic emission sensing. Additional information regarding FBG sensors and interrogation of data therefrom may be found in U.S. Pat. Pub. No. 20210118654, which is incorporated by reference herein for all purposes consistent herewith.

Figure 1:
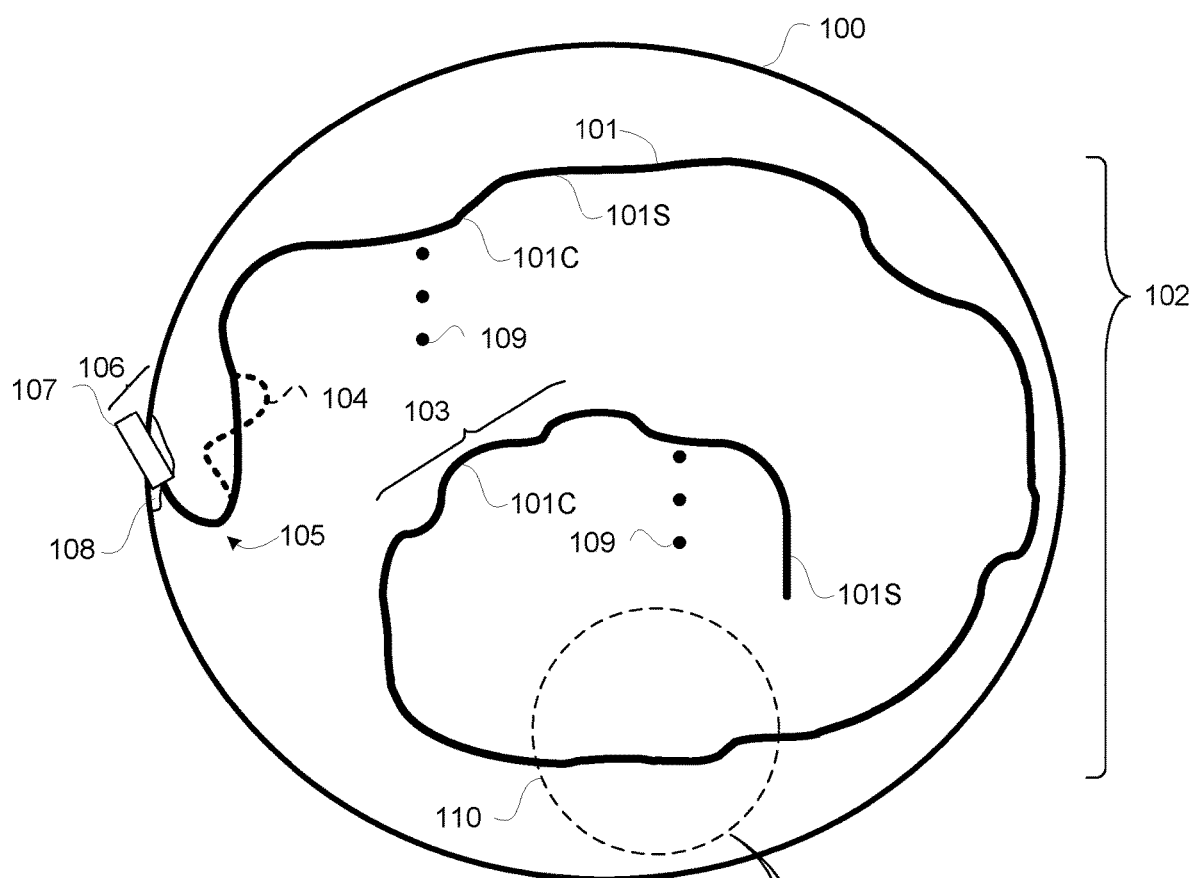
FIG. 1-1 is a planar diagram of a top-down inclined view depicting an example of a test wafer.

FIG. 1-1 is a planar diagram of a top-down inclined view depicting an example of a test wafer 100. Even though a test wafer 100 is depicted for purposes of clarity by way of example and not limitation, other types of platforms, whether circular or other shape, may be used. For example, such a platform may have a planar or nonplanar surface. Even though test wafer 100 is a depicted as a wafer used in the manufacture of semiconductor devices, other materials may be used for formation of a test wafer or platform as described herein. For example, materials such as silicon, quartz, ceramic, metal, or other material suitable for attachment or coupling of an optical fiber as described herein may be used. In some aspects, a platform, which may be of a structure, is machinable, etchable, or otherwise capable of having a trench formed therein.

As described herein, trench 101 is a wavy trench. However, trench 101 may have one or more wavy or curved portions or sections, such as for example curved section 101C, and/or one or more straight portions or sections, such as for example straight section 101S. In this example, a distal or inner end 104 of trench 101 is formed as a straight section 101S At a high-level, trench 101 generally has a spiral or spiral-like overall pattern or shape 102. However, other overall patterns or shapes, or combinations thereof, may be used such as for example a serpentine pattern, a yin and yang divider pattern, and/or another pattern. Furthermore, a spiral may be circular, oval, rectangular-like (e.g., with rounded corners), square-like (e.g., with rounded corners), or other shape or pattern or combination of shapes or patterns.

However, within an overall shape of trench 101 may be other forms, such as for example a serpentine or serpentine-like section 103 and an optional strain-relief section 104. Optional strain-relief section 104 may have a serpentine pattern or shape. Optional strain-relief section 104 may be generally proximate to a test wafer 100 or platform signal ingress/egress end 106 with respect to providing an optical fiber for attachment or coupling to such wafer or platform. Furthermore, at least one retention curve 105 may be formed proximate to such ingress/egress end 106 of an optical fiber to such wafer or platform.

Further at such end 106 may optionally be a feed tube 107. Feed tube 107 may be attached to test wafer 100 via a friction fit into trench 101 or by an adhesive or epoxy 108 as in this example. Feed tube 107 may be a peek tube for high-heat applications. However, a glass, PTFE, PEEK, ceramic, or other type of tubing may be used. In another example, a mechanical device may be used to attach feed tube 107 to test wafer 100.

Figures 1, 2:
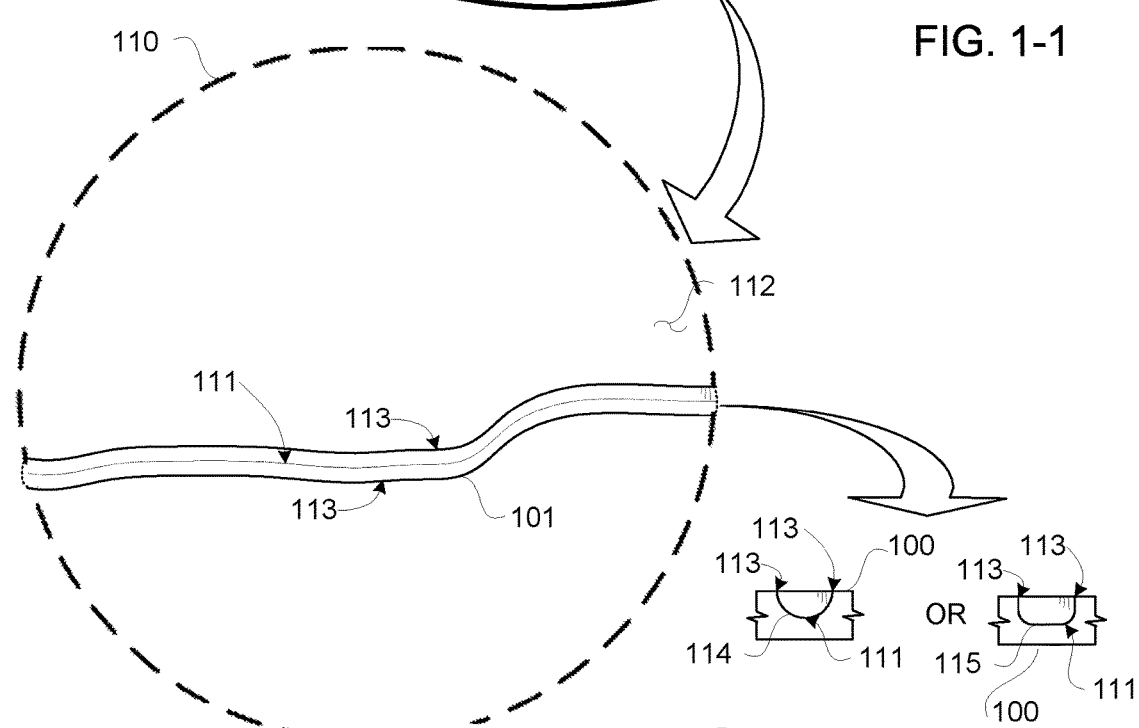

FIG. 1-2 is a planar diagram of a top-down view depicting an example of an enlarged portion 110 of test wafer 100 of FIG. 1-1 with enlarged cross-sectional views of a portion of test wafer 100 for different types of trench profiles. With simultaneous reference to FIGS. 1-1 and 1-2, test wafer 100 is further described.

Trench 101 may have a bottom surface 111 and sidewall surfaces 113. Sidewall surfaces 113 may intersect an upper (or lower) surface 112 of test wafer 100. Trench 101 may have a curvilinear profile 114 or a rectilinear profile 115, such as for example in respective cross-sectional views in FIG. 1-2, with respect to sidewall surfaces 113 and bottom surface 111 thereof.

As generally indicated with ellipsis 109, there may be multiple trenches 101 formed with same of different patterns for having multiple optical fibers on a test wafer 100. However, for purposes of clarity and not limitation, a single trench 100 for a single optical fiber is described. Furthermore, even though a one-to-one correspondence between trench and optical fiber is described, in another example more than one optical fiber may co-located fully and/or partially in a trench.

Figures 1, 2:
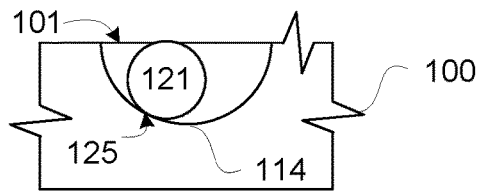
Figure 2:
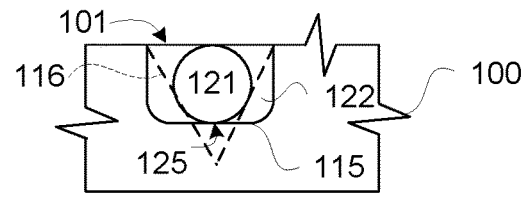
Figures 2, 3:
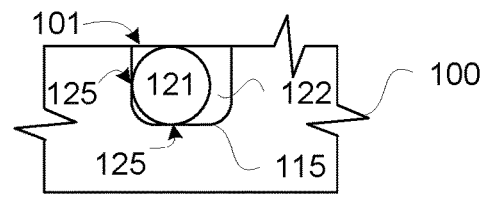

FIG. 1-3 is a planar diagram of a top-down inclined view depicting an example of a test wafer 100. As test wafer 100 of FIG. 1-3 is same or similar to that of FIG. 1-2, generally only differences are described for purposes of clarity and not limitation. FIG. 1-4 is a top-down view depicting an example of an enlarged portion 110 of test wafer 100 of FIG. 1-3 with an enlarged cross-sectional view of a portion of test wafer 100. With simultaneous reference to FIGS. 1-1 through 1-4, test wafer 100 is further described.

An optical fiber 120 (a white-gray line on a black line for trench 101 in FIG. 1-3 and a black line in FIG. 1-4) includes a plurality of FBG sensors 121, generally depicted as white-gray segments on a black line in FIG. 1-4). Even though FBG sensors are described for purposes of clarity by way of example, other types of inline optical fiber sensors may be used.

In this example, a free end portion 118 of optical fiber 120 may be attached or coupled to test wafer 100 with spin-on-glass 117. In this example, trench 101 is not to a perimeter edge 119 of test wafer 100, but rather starts inward therefrom after an optional trench offset or setback. An end portion 118 may be along upper surface 112 or cantilevered or free-standing away from such upper surface. In an application where strain is excessive, such as for example greater than 40,000 microstrains, a convention stress reducer (not shown) may be used.

FGB sensors 121 may be aligned in corresponding alignment regions 101A to respectively be in curved sections 101C. Because curved sections are used, each FBG sensor 121 is more isolated with respect to strain from one or more neighboring FBG sensors 121. In other words, strain with respect to or on an FBG sensor 121 may be more localized to a curved section 101C. Using curved sections 101C for corresponding FGB sensors 121 reduces opportunity for strain to transfer from one sensor to another along an optical fiber 120. While using a wavy trench 101 can provide localized strain, strain may buildup over the length of an optical fiber 120 in some applications exceeding 40,000 microstrains, and in such applications a strain reducer package may be used prior to processing information obtained from FBG sensors 121.

In this example, a curvilinear profile 114 of trench 101 is used; however, in another example a rectilinear profile 115, which may include rounded or straight corners, may be used. A bottom center of an FBG sensor 120 may be in direct contact with a bottom center of profile 114, or bottom surface 111, for a line contact 125 in a bottom-to-bottom surface-to-surface direct line contact region 126. For example, a bottom center line of an FBG sensor 121 may be in direct contact along a length thereof with a bottom center line of bottom surface 111 for a line contact 125 in region 126. Depending on geometries used in an application, such a contact region 125 may be from 0 to 90 degrees along an arc length of profile 114.

In an example where an FBG sensor 121 diameter is less than a host optical fiber 120 diameter and is centered thereto, FBG sensor 121 may be pressed in place for such a bottom-to-bottom surface-to-surface direct line contact region 125 and held in place with a thermal adhesive or epoxy 122 after curing. Thermal epoxy 122 may be even with upper surface 112. Along those lines, an uppermost surface of a core of optical fiber 120 may be below or even with 124 a top or upper surface 112 of test wafer 100 for use of thermal adhesive or epoxy 122. While thermal adhesive or epoxy 122 may fill gaps between profile 114 and an outer surface of FBG sensor 121, a gap 123 between such surfaces may be present. In another example, trench 101 may be lined with thermal adhesive or epoxy 122 and FBG sensors 121 may be pressed into position, namely a bottom-up attachment, rather than a top-down attachment as in this example. While an entire length of an optical fiber 120 may be attached with thermal adhesive or epoxy 122, generally only FGB sensors 121 may be attached with thermal adhesive or epoxy 122 for obtaining thermal and/or strain readings. In an embodiment, an array of an FBG sensor 121 may not be subjected to epoxy 122, but may be pinned down and ends of such sensor or near ends of such sensor. This may allow an array to expand to reduce strain.

FIGS. 2-1 through 2-6 are respective planar diagrams of cross-sectional views depicting examples of trenches 101 of corresponding portions of test wafers 100. As test wafers 100 of FIGS. 2-1 through 2-6 are same or similar to test wafers 100 of FIGS. 1-1 through 1-4, generally only differences are described for purposes of clarity and not limitation. Wafers 100 of FIGS. 2-1 through 2-6 are further described with simultaneous reference to FIGS. 1-1 through 2-6.

In FIG. 2-1, FBG sensor 121 has a line contact 125 with a side portion of profile 114 to a side (left of bottom center) portion of FBG sensor 121 of a trench 101 having a profile 114. In FIG. 2-2, FBG sensor 121 has a line contact 125 with a bottom surface of trench 101 having a profile 115. In this example profile 115 has rounded interior or bottom corners. Furthermore, in this example, other than optical fiber 120, trench 101 may be filled with an epoxy 122. However, in another example, a V-shaped groove profile 116 may optionally be used. Furthermore, in another example a combination of profiles 115 and 116 may optionally be used, such as a V-shaped groove on sidewalls though with a flat bottom. A V-shaped groove or a sloped sidewall or trapezoidal profile may be used to have one or more line contacts 125.

Figures 2, 3, 4:
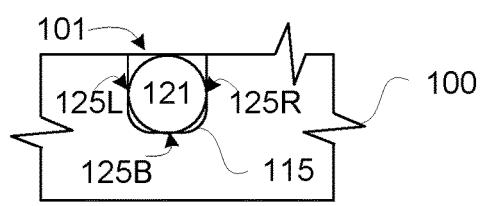

In FIG. 2-3, FBG sensor 121 has a line contact 125 with a bottom surface and another line contact 125 with a side surface of trench 101 having a profile 115. In FIG. 2-4, FBG sensor 121 has a line contact 125B with a bottom surface, another line contact 125L with a left-side surface of trench 101 having a profile 115, and another line contact 125R with a right-side surface opposite a left side surface line contact 125L of trench 101 having a profile 115.

In FIG. 2-5, bottom-up thermal epoxy or adhesive 122 is applied to a bottom and/or lower surface of trench 101 having a profile 114. In this example, an upper air gap or space 123 in trench 101 is left after epoxying. In this example, a portion 127 of FBG sensor 121 extends above or higher than a top surface of wafer 100.

In FIG. 2-6, thermal epoxy or adhesive 122 is applied to a bottom and/or lower surface of trench 101 having a profile 114 for surrounding FBG sensor 121 other than line contact 125 and other than an optional expansion gap 128. In this example, an optional upper air gap or expansion gap 128 may be located between a top of FBG sensor 121 and a bottom of an optional upper layer or structure 130. Expansion space in trench 101 may be left after epoxying with epoxy or adhesive 122 and after attachment or coupling of upper structure 130.

In this example, an upper structure 130 may be another wafer of same of different material as wafer 100. In another example, upper structure 130 may be a glass frit. In this example, upper structure 130 is another wafer of a same material as test wafer 130 in order to have same coefficients of thermal expansion. A bonding interface or interface layer 129 between an upper surface of test wafer 100 and a lower surface of upper structure 130 may be formed using conventional wafer-to-wafer bonding or hybrid bonding or other thin interface bonding. In another example, an optional upper layer or structure 130 may be deposited, which may include in part into trench 101.

FBG sensors 121 can be used for determining or measuring temperature, acoustic emission (AE), and/or strain in a same fiber. Along those lines, one or more of FBG sensors 121 of an optical fiber 120 may be designated for temperature or AE, and one or more others of such FGB sensors 121 of such optical fiber 120 may be designated for strain. Temperature and AE information may be obtained from a same FBG sensor 120, with multiplexing or bifurcating for information processing in different domains, as AE and temperature used different forms of information processing of sensor data. Transfer of strain information from an FBG sensor 121 is different than temperature or AE with respect to a Bragg wavelength.

Because of wavy contours of a trench 101, temperature/AE and strain, including without limitation strain rosettes, FBG sensors 121 may all be on a same optical fiber 120 with multiplexing of information for each to parse out temperature data processing, AE data processing, and/or strain data processing. In other words, wavy contours allow for localization of information which facilitates an ability to parse such information for different contexts, namely temperature, strain, and AE. Furthermore, such FBG sensors 121 with respect to such different contexts may be in interleaved with respect to one another, have dedicated sections for each such context, or other form of arrangement. For example, a single channel may be used with different gratings of FBG sensors 121 with information multiplexing of output of an optical fiber 120 from such FBG sensors 121.

Curves of a wavy trench in addition to localizing strain, namely do not readily transfer strain as compared with straight sections of an optical fiber, do not overly stress FBG sensors 121, even in the presence of a large wavelength shift. This allows for strain compensation for AE to be avoided or substantially reduced.

Every strain rosette uses a temperature sensor. Many strain rosettes and corresponding temperature sensors may be on same structure by adding a strain reducer. For example, temperature sensors and strain rosette sensors may be on a same structure and may be on a same optical fiber with multiplexing of outputs due to positioning or conforming optical fiber 120 to wavy contours of a trench 101 with positioning of such FBG sensors in corresponding curved sections.

FIGS. 3-1 and 3-2 are planar diagrams of respective cross-sectional views depicting examples of surface mounting of optical fiber 120 to corresponding portions of test wafers 100. As test wafers 100 of FIGS. 3-1 and 3-2 are same or similar to test wafers 100 of FIGS. 1-1 through 1-4, generally only differences are described for purposes of clarity and not limitation. Wafers 100 of FIGS. 3-1 through 3-2 are further described with simultaneous reference to FIGS. 1-1 through 3-2.

In FIG. 3-1, line contact 125 is formed by contacting an FBG sensor 121 of an optical fiber 120 to an upper surface 112 of a test wafer 100. An epoxy or adhesive 122 may be disposed on opposing sides of optical fiber 120, which may include on opposing sides of an FBG sensor 121, an exterior coating or core of optical fiber 120, and/or bare optical fiber 120. Epoxy or adhesive 122 may be used for holding FBG sensor 121 in direct contact with upper surface 122. Epoxy or adhesive 122 may be used for holding optical fiber 120 in direct contact with upper surface 122.

In FIG. 3-2, line contact 125 is formed by contacting an FBG sensor 121 of an optical fiber 120 to an upper surface 112 of a test wafer 100. An epoxy or adhesive 122 may be disposed on opposing sides and over the top of optical fiber 120, which may include on opposing sides and over the top of an FBG sensor 121, an exterior coating or core of optical fiber 120, and/or bare optical fiber 120. Epoxy or adhesive 122 may be used for holding FBG sensor 121 in direct contact with upper surface 122. Epoxy or adhesive 122 may be used for holding optical fiber 120 in direct contact with upper surface 122.

Optical fiber 120 may have a jacket or coating 137. For jacket tubing, such as stainless steel or PTFE tubing for example, An FBG sensor chain inside optical fiber 120 may be able to more freely expand, namely with little or without any strain, in a straight or slight curved shape. Along those lines, a jacket or coating 137 may be used for optical fiber 120 surface mounted, partially in a trench 101, or wholly in a trench 101, as described herein. Even though tubing is described, in another example a coating 137 may be used, such as for example a diamond or PTFE coating.

In a surface mounting, there may be no curves to mount sensors in such as in a wavy trench 101 example. Curve-to-FBG sensor alignment, uses curvature to localize an FBG sensor to a corresponding local curve from other neighboring sensors, which may or may not be in alignment with other curved sections. Localizing a sensor to a curved section or a flat section or a bumped section may include application of some force using elasticity of an optical fiber 120. Along those lines, force may be localized to normal force to a line contact surface. By having curves, tangential forces with respect to each FBG sensor in a curved section may be substantially reduced or not present. Reduction of tangential forces may improve FBG sensor accuracy and/or repeatability.

FIGS. 4-1 through 4-3 are block diagrams of respective side views depicting examples of optical fiber normal force attachment. Even though top-down examples are provided, normal force to a sidewall may likewise be used. Moreover, even though examples of straight sections, curved sections may be used.

A line contact surface 131 may be of a top surface of a test wafer, a bottom surface of a trench of a test wafer, a sidewall surface of a trench of a test wafer, or other structure. An optical fiber 120 having an FBG sensor 121 may be positioned to line contact surface 131, and a normal force within plus or minus 15 degrees may be applied to cause FBG sensor 121 to be in line contact 125 with line contact surface 131. Force 132 against line contact surface 131 may be thought of as an elasticity force.

For line contact surface 131 including a step 133 or a bump 134 corresponding to approximately half of a difference between a diameter d1 of FBG sensor 121 and a diameter d2 of optical fiber 120. To reduce tension, diameter d1 may be about 75 to 95 percent of diameter d2. However, by using a curved surface for line contact, though a curved line contact, tangential force 135 with respect to such line contact may be reduced or avoided. Additionally, selecting an optical fiber 120 having a coefficient of thermal expansion same or similar to test wafer 100 may reduce tension. Furthermore, an optical fiber may have a coating, and such coating may have a coefficient of thermal expansion to consider.

Figures 2, 3, 4, 5:
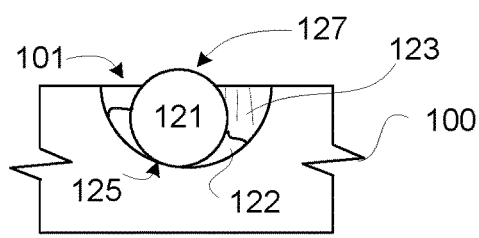

FIG. 5-1 is a perspective diagram of a cross-sectional cutaway view depicting an example of a portion of a test wafer 100 having an FBG sensor 121 positioned in a curved section 141 of a trench 101. In this example, a bottom of trench 101 has an undulating surface or a surface with bumps, such as for example bumps 134. However, in another example, a flat-bottomed surface for trench 101 may be used as previously described with respect to a line contact surface.

However, in this example, depth D2 from upper surface 112 to a bottom surface of trench 101 in regions of non-sensor optical fiber 120 is greater than depth D1 from upper surface 112 to a bottom surface of trench 101 in regions of sensor optical fiber 120.

In this example, a low thermal expansion epoxy 122 is located on either end and respectively spaced away from FBG sensor 121. Epoxy 122 may be used to bridge non-sensor sections of optical fiber 120. While in this example FBG sensor 121 is not covered with epoxy 122, in another example FBG sensor 121 may be covered with epoxy 122. However, in this example, a grating area or volume of FBG sensor 121 is in free space other than a line contact portion thereof.

Retention using alternating arcs or curves (e.g., concave, convex, concave, convex, etc.) may be useful for a length of fiber, which may be used at atmospheric pressure without epoxy using elasticity of optical fiber 120 and friction to create a contact retention region to hold or position to curved surfaces. However, for vacuum or near vacuum pressures, use of epoxy for retention may improve consistency of results. Optical fiber 120 may be have bending regions thereof to corresponding inside and outside curves of corresponding curved sections of a trench 101, such as along a sidewall and/or bottom thereof.

Contacts can be uniform in amount, such as circumferential sections of FBG sensors to corresponding sidewall and/or bottom sections of a trench. In an example, a trench can have a general depth D2 for non-sensor sections, and a depth D1 for sensor sections, where D1 is less than D2 by an amount of approximately ½ (d2−d1) where d2 is diameter of an outer fiber core in non-sensor sections of optical fiber 120 and d1 is diameter of outer sensor core in sensor sections of optical fiber 120.

FIG. 5-2 is a perspective diagram of a cross-sectional view depicting an example of a portion of a test wafer 100 having an optical fiber 120 positioned in a section of a trench 101. Optionally, trench may be formed by an isotropic wet etch to form undercut regions 142.

Figures 2, 3, 4, 5, 6:
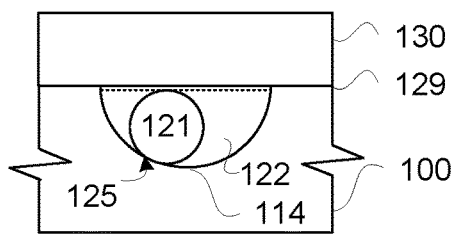
Figures 1, 3:
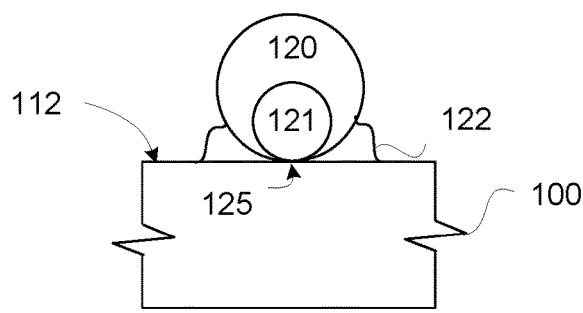
Figures 2, 3:
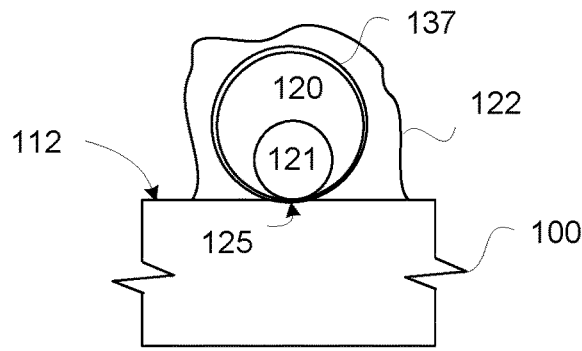
Figures 1, 4:
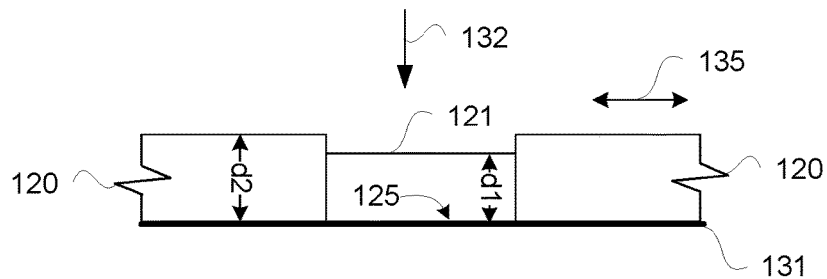
Figures 2, 4:
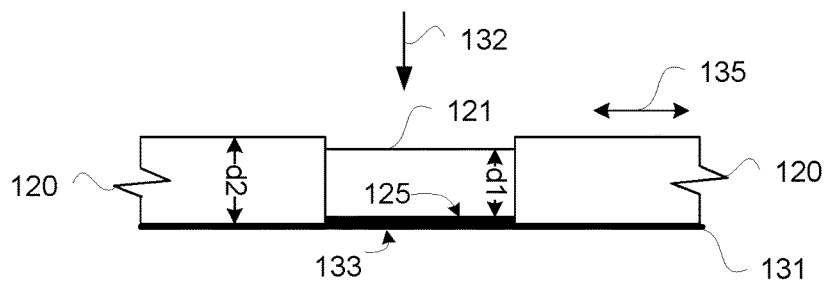
Figures 3, 4:
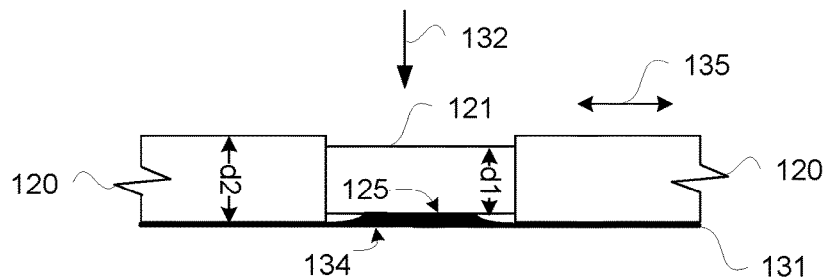
Figures 1, 5:
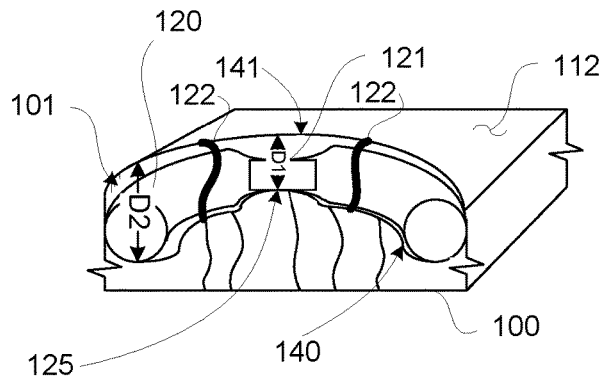
Figures 2, 5:
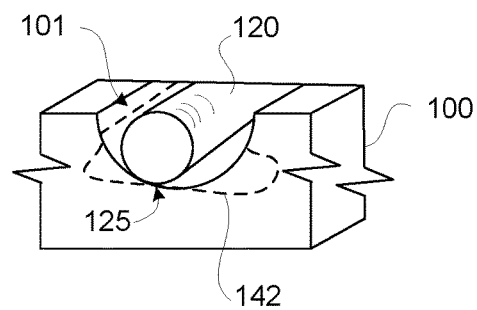
Figures 1, 6:
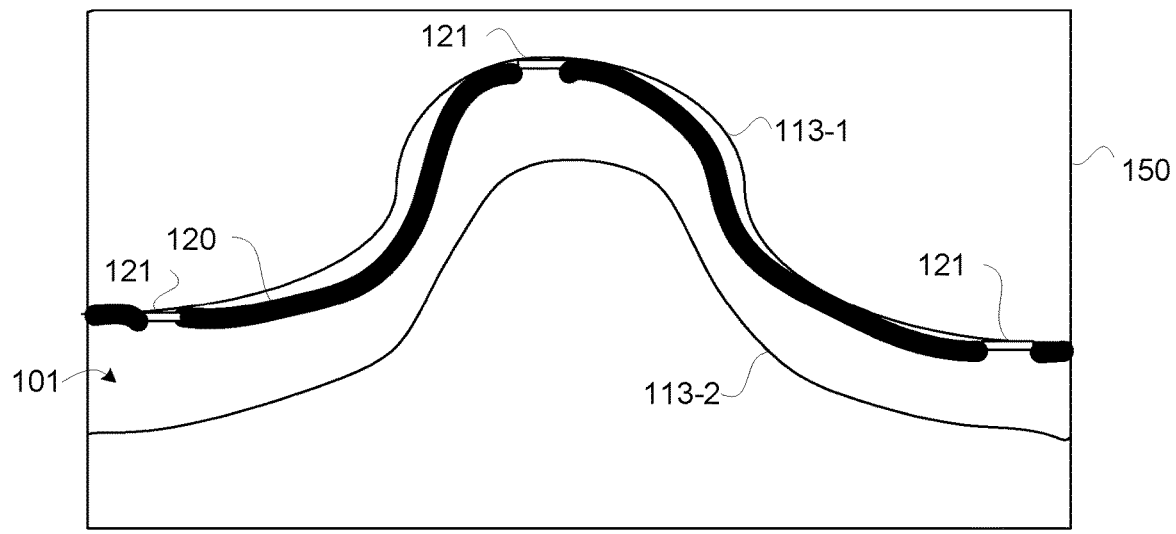
Figures 2, 6:
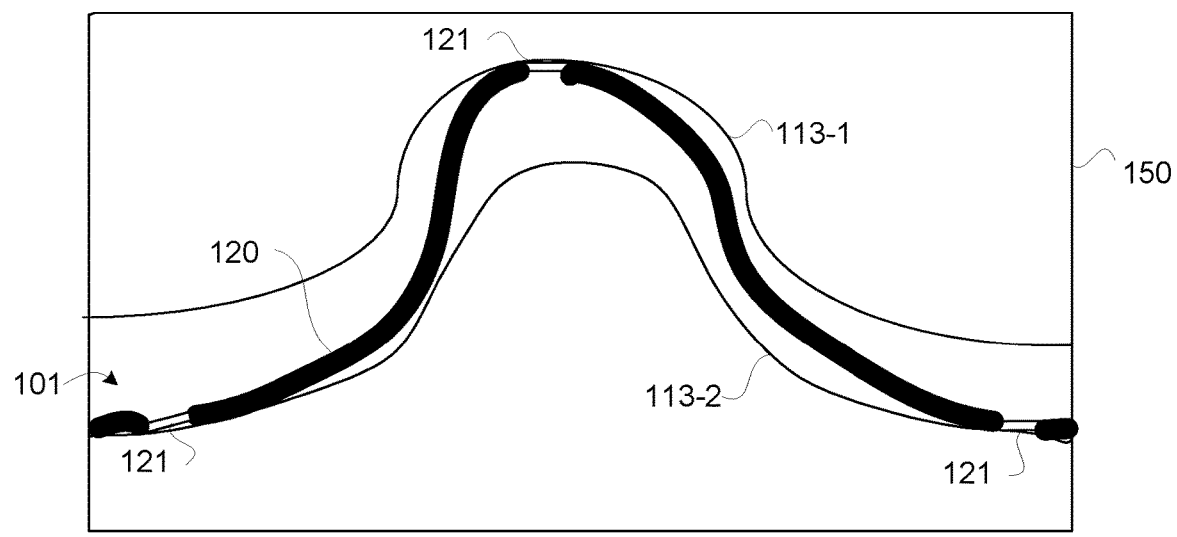

FIG. 6-1 is a planar diagram of a top-down view depicting an example of a flexible strip 150 having a trench 101. Flexible strip 150 may be used to conform to a surface to be measured. Even though a rectangular strip is depicted for purposes of example, strip 150 may be any of a variety of shapes and sizes. Even though a flexible strip 150 is described, a test wafer, as described herein, may likewise have a trench 101 with an optical fiber 120.

Optical fiber 120 includes FBG sensors 121. Each of FBG sensors 121 may be in whole or in part in line contact with a corresponding outer radius of curvature of curve section, namely a curved section of a sidewall 113-1 of trench 101. A corresponding inner radius of curvature of a curved section sidewall 113-2 with respect to sidewall 113-1 may have no FBG sensors 121 in line contact therewith. In this example, all FBG sensors 121 are on a same side, or more particularly an outer radius of curvature sidewall 113-1.

FIG. 6-2 is a planar diagram of a top-down view depicting an example of a flexible strip 150 having a trench 101. Flexible strip 150 may be used to conform to a surface to be measured. Even though a rectangular strip is depicted for purposes of example, strip 150 may be any of a variety of shapes and sizes. Even though a flexible strip 150 is described, a test wafer, as described herein, may likewise have a trench 101 with an optical fiber 120.

Optical fiber 120 includes FBG sensors 121. One or more of FBG sensors 121 of optical fiber 120 may be in whole or in part in line contact with a corresponding curve section of a sidewall 113-1 of trench 101. A corresponding sidewall 113-2 with respect to sidewall 113-1 may have one or more other FBG sensors 121 of a same optical fiber 120 may be in line contact with corresponding curved section of sidewall 113-2. In this example, FBG sensors 121 respectively alternate between sidewalls 113-1 and 113-2 for line contacts respectively therewith. Alternating line contacts from one sidewall to another of a trench 101 may be useful for reducing tangential force. Furthermore, alternating line contacts from one sidewall to another of a trench may be useful in an application where temperature can exceed 300 Celsius.

For temperature sensing in vacuum or near vacuum, an example implementation may include: a combination of epoxy bonding on both sides of an FBG sensor 121; a curved FBG sensor 121 orientated for shape retention using fiber elastic axial (normal) force, namely contouring an FBG sensor 121 to a curved sidewall using a normal force and fiber elasticity; and line contact at a grating area between an FBG sensor 121 and a surface of a wafer 100, fiber jacket 137, or structure (if bare fiber is used).

An FBG sensor 121 can be coated or uncoated as part of an optical fiber 120. For high temperature up to 350 C, a polyimide coated FBG sensor 121 can be used for example or other suitable temperature resistant coating. For a temperature above 350 C, a bare optical fiber 120, namely with coating removed or no coating, or an optical fiber 120 with a high temperature coating, such as diamond coating, gold coating, or spin-on-glass coating for example, can be used.

For both strain and temperature sensing, a strain FBG sensor 121 can be separately packaged from a temperature package. For example, a strain package optical fiber 120 may have FBG sensors 121 calibrated for strain and for direct coupling or direct contact to a structure. This may allow an entire strain sensor package to be directly bonded to a surface structure for monitoring strain. Monitoring strain without some form of direct contact with a structure or direct coupling, such as through bonding, to a structure being monitored may be more problematic than using a direct contact or a direct coupling. In contrast, a temperature monitoring package, such as for example including an optical fiber 120 with FBG sensors 121 calibrated for monitoring temperature, which may or may not have a direct coupling or direct contact with a structure monitored, or an environment monitored. Along those lines, temperature sensors 121 on directly on a wafer or coupled with an intervening jacket can be in contact with a surface using tape, point contact using epoxy, or other mechanical means such as clamp, magnetic, or vacuum suction, to reduce or minimize strain transfer and enhance or maximize thermal conduction.

Figure 7:
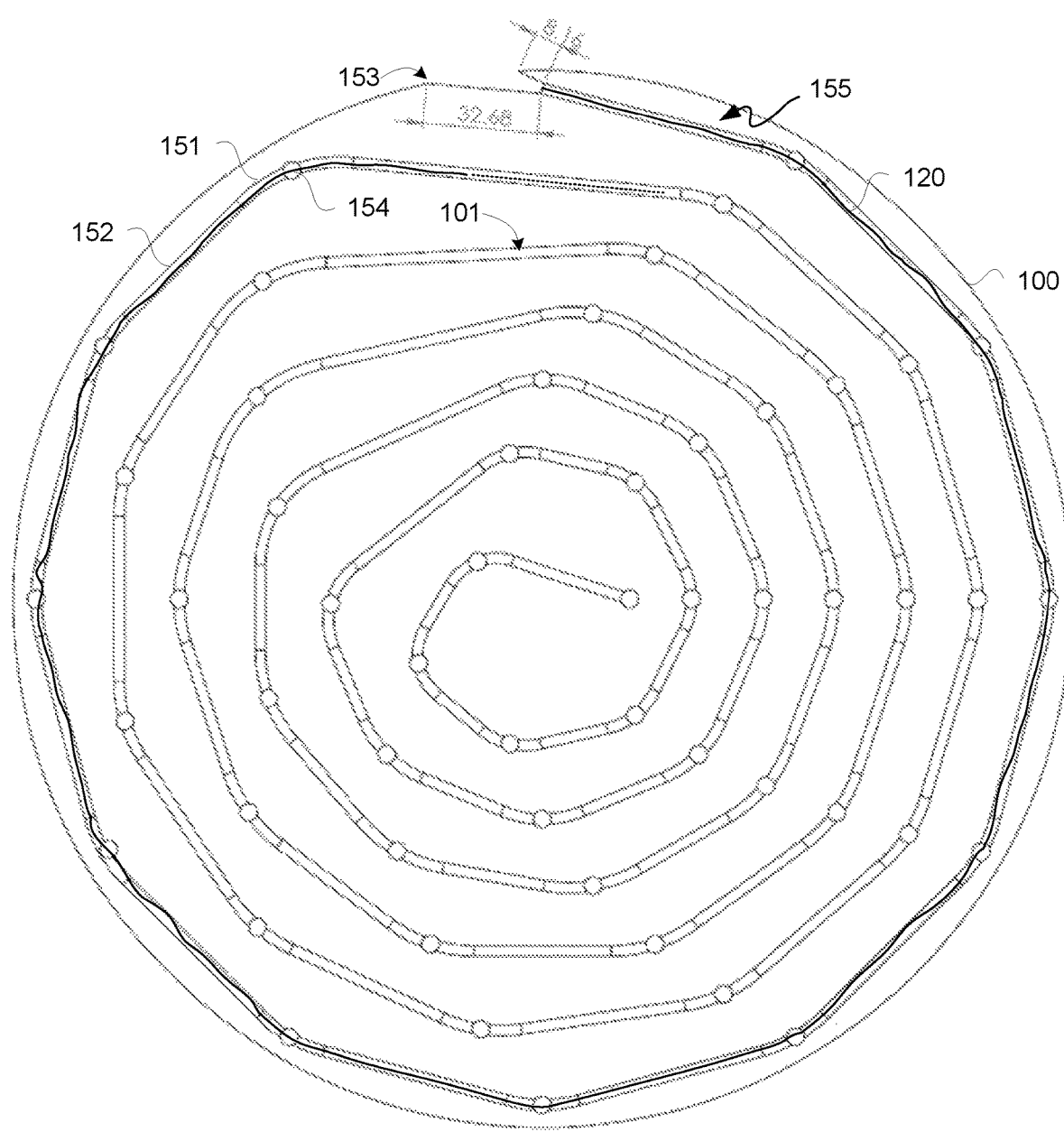
FIG. 7 is a planar diagram of a top-down view depicting another example of a fiber optic test wafer.

FIG. 7 is a planar diagram of a top-down view depicting another example of a fiber optic (FO) test wafer 100. To affix a sensor chain in or to a wafer, a PTFE lift off mold, such as for example with 300 micron (um) deep, 3 mm wide trench/microchannel 101 formed in a spiral/straight curve pattern 155 with interspersed through hole vias 154. Hole vias 154 may be located in corresponding curved sections 151.

A portion of an optical fiber 120 is shown for purposes of clarity by way of example. Such an optical fiber 120 may include a sensor chain of FBG sensors and can be inserted in a mold along a microchannel trench 101. Such mold may be covered with a thin cover glass or silicon wafer substrate, followed by injection of high temperature glass-based epoxy from a mold backside where via 154 openings are located.

Once such epoxy is cured, such mold may be lifted off leaving a surface mounted sensor chain of optical fiber 120 in place. To protect sensors, another cover glass/silicon wafer can be used over such sensor chain of optical fiber 120, such as where lift off mold was previously located. Optionally, an edge of a base, as well as of a protective wafer or layer, can be sealed with a high temperature epoxy if hermetic seal is to be used for sensor protection.

In another example, a PTFE mold can be replaced with a glass/si wafer. In this example, there may be no gap between a substrate and cover wafers since optical fiber 120 is recessed inside such substrate wafer.

A mold may be formed with a CNC machine. Glass/silicon microchannels can be formed using lithographic-semiconductor fabrication processing. A high-temperature epoxy can be glass-based epoxy or high temperature glass solder, such as a high temp silica beads mixed in organic paste.

A short glass capillary can be used to protect a fragile fiber lead in (ingress) where a round via may be replaced with a rectangle through hole via at the edge 153 of test wafer 100. In this example, FBG sensors reside in curved sections 151. However, in another example, FBG sensors may reside in straight sections 152. A tight bending optical fiber 120 may be used to limit or reduce optical loss.

Figures 1, 8:
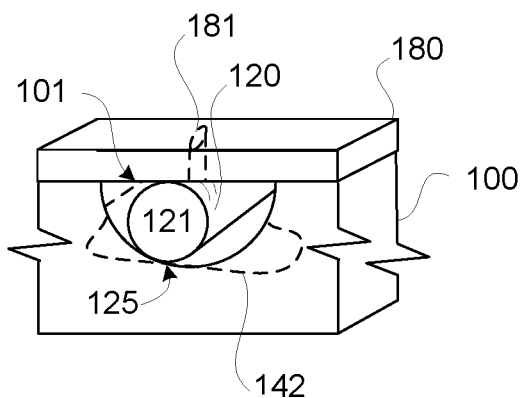
Figures 2, 8:
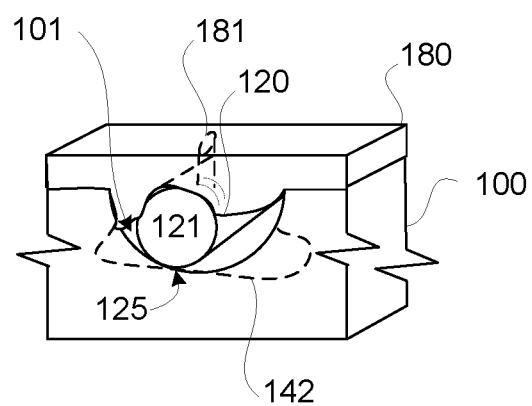

With reference to FIG. 8-1, there is shown a perspective diagram of a cross-sectional view depicting an example of a portion of a test wafer 100 having an optical fiber 120 positioned in a section of a trench 101 with a cover layer 180. Optionally, trench may be formed by an isotropic wet etch to form undercut regions 142, such as previously described with reference to FIG. 5-2.

Cover layer 180 may be a wafer, such as for example a glass, silicon or ceramic wafer for example, a deposited layer, such as for example a diamond coating layer, or other layer. In this example, cover layer 180 is a glass frit. Along those lines, though a glass frit is generally bendable, a glass frit may bridge a trench 101, where an upper surface portion of optical fiber 120 may or may not make contact with a lower surface portion of cover layer 180.

A distinction between a structural layer and a deposited layer for a cover layer 180 may be observed where a portion of such deposited layer dips below an upper surface portion of optical fiber 120 in trench 101. In this example, an FBG sensor 121 and optical fiber 120 may have a same diameter, as a bare fiber may be used. Such a bare fiber for optical fiber 120 may be original or may result from removal of a jacket from optical fiber 120.

In this example, a solid cover layer 180 may be used. However, in another example, a perforated cover layer 180 may be used, where such cover layer defines one or more through holes 181. Holes 181 may extend from an upper surface of cover layer 180 to a lower surface thereof. In this example, a through hole 181 is positioned to be directly above a trench 101. In this example, a through hole 181 is further positioned to be directly above an FBG sensor 121.

With reference to FIG. 8-2, there is shown a perspective diagram of a cross-sectional view depicting an example of a portion of a test wafer 100 having an optical fiber 120 positioned in a section of a trench 101 with a deposited cover layer 180. Optionally, trench may be formed by an isotropic wet etch to form undercut regions 142, such as previously described with reference to FIG. 5-2.

FIGS. 8-1 and 8-2 are similar, except that in FIG. 8-2 a deposited cover layer 180 is illustratively depicted. Along those lines, a deposited cover layer 180 may extend into trench 101 along each side of such trench, as well as along right and left sides of optical fiber 120. In this example, gaps, such as air gaps, are illustratively depicted as between a bottom surface portion of trench 101 and a lower surface of cover layer 180. Again, optional holes 181 may be formed in cover layer 180. In this example, such holes 181 may be formed by first depositing a sacrificial masking layer patterned to define locations of holes 181 followed by deposition of cover layer 180 and then removal of such sacrificial or masking layer.

Figure 9:
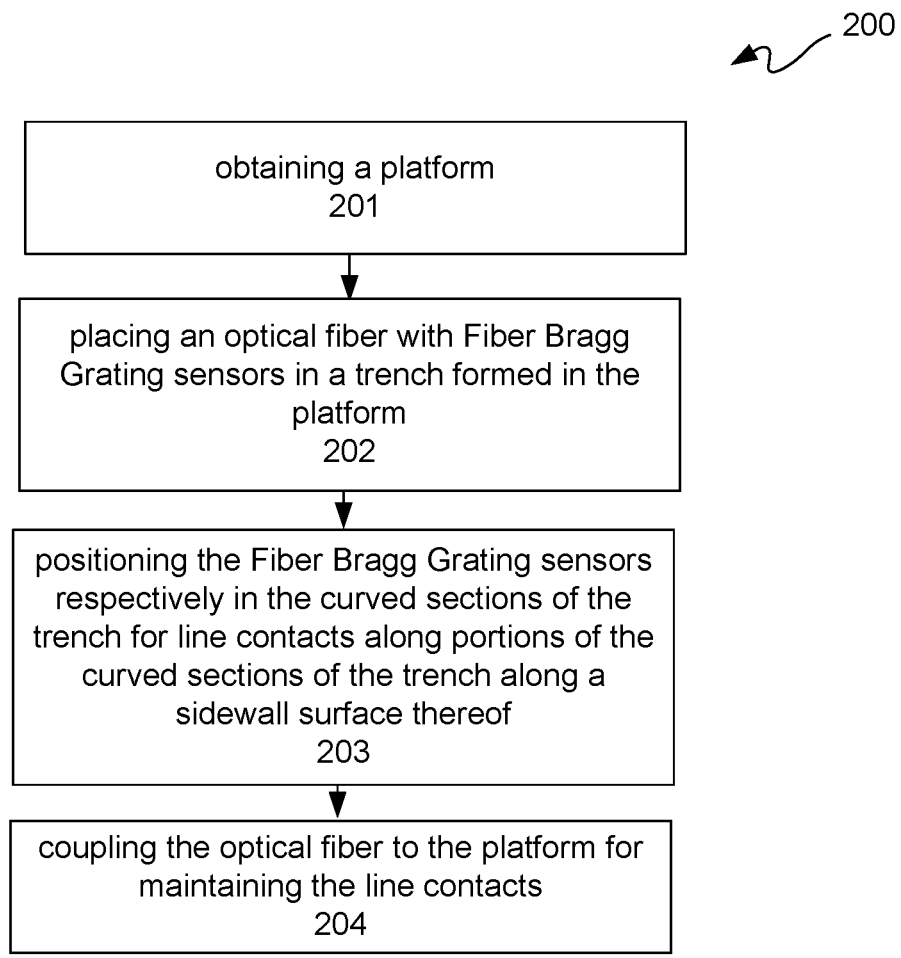
FIG. 9 is a flow diagram depicting an example of an assembly flow.

FIG. 9 is a flow diagram depicting an example of an assembly flow 200. Assembly flow 200 is further described with simultaneous reference to FIGS. 1-1 through 9.

At operation 201, a platform is obtained. Such a platform may be a test wafer 100 as previously described. At operation 202, an optical fiber 120 with FBG sensors 121 is placed in a trench 101 formed in such a platform. Trench 101 has curved sections 101C, as previously described herein. Additionally, trench 101 may have an overall pattern, as previously described herein.

At operation 203, FBG sensors 121 are respectively positioned in curved sections 101C of trench 101 for line contacts along portions of such curved sections of such trench along a sidewall surface 113 thereof. Optical fiber 101, away from FBG sensors 121, may be bonded or otherwise coupled at operation 204 to such a platform, such as a test wafer 100 for example, for maintaining such line contacts. In an example, such curved sections may each be outer radii of curvature of such a sidewall surface 113 of trench 101.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
   a platform;
   an optical fiber with Fiber Bragg Grating sensors located in a trench formed in the platform, wherein the trench has curved sections;
   the Fiber Bragg Grating sensors respectively in the curved sections of the trench;
   the Fiber Bragg Grating sensors respectively positioned for line contacts along portions of the curved sections of the trench along a sidewall surface thereof;
   an epoxy located at each end of every Fiber Bragg Grating sensor and respectively spaced away therefrom to bridge non-sensor sections of the optical fiber; and
   a grating volume of one or more of the Fiber Bragg Grating sensors in a corresponding free space other than a respective line contact thereof for measurement of temperature of the platform independent of strain.

2. The apparatus according to claim 1, wherein the platform is a test wafer.

3. The apparatus according to claim 1, wherein the trench has a spiral or spiral-like overall pattern.

4. The apparatus according to claim 3, wherein the trench has at least one serpentine strain-relief section.

5. The apparatus according to claim 4, wherein the trench has a retention curve proximate to an ingress end of the optical fiber to retain the optical fiber to the platform.

6. The apparatus according to claim 5, further comprising a feed tube coupled at the ingress end.

7. The apparatus according to claim 5, wherein the trench has a curvilinear profile.

8. The apparatus according to claim 5, wherein the trench has a rectilinear profile.

9. The apparatus according to claim 5, wherein the ingress end is coupled to the platform with a spin-on-glass.

10. The apparatus according to claim 5, wherein the ingress end is positioned away from an upper surface of the platform.

11. The apparatus according to claim 1, wherein the curved sections are outer radii of curvature of the sidewall surface of the trench.

12. The apparatus according to claim 1, wherein:
    the one or more of the Fiber Bragg Grating sensors is a first portion of the Fiber Bragg Grating sensors for measurement of temperature and a second portion of the Fiber Bragg Grating sensors are for measurement of strain.

13. The apparatus according to claim 1, wherein a first portion of the Fiber Bragg Grating sensors are for measurement of acoustic emission and a second portion of the Fiber Bragg Grating sensors are for measurement of strain.

14. The apparatus according to claim 1, wherein a first portion of the Fiber Bragg Grating sensors are for measurement of acoustic emission, a second portion of the Fiber Bragg Grating sensors are for measurement of acoustic emission, and a third portion of the Fiber Bragg Grating sensors are for measurement of strain.

15. The apparatus according to claim 1, further comprising an upper structure bonded to the platform.

16. The apparatus according to claim 15, wherein the upper structure is a first wafer, and wherein the platform is a second wafer.

17. The apparatus according to claim 15, wherein the upper structure is a glass frit.

* * * * *